United States Patent
Lin et al.

(10) Patent No.: US 7,551,494 B2
(45) Date of Patent: Jun. 23, 2009

(54) SINGLE-POLY NON-VOLATILE MEMORY DEVICE AND ITS OPERATION METHOD

(75) Inventors: Chrong-Jung Lin, Taipei Hsien (TW);
Hsin-Ming Chen, Tainan Hsien (TW);
Shih-Jye Shen, Hsin-Chu (TW);
Ya-Chin King, Tao-Yuan Hsien (TW);
Ching-Hsiang Hsu, Hsin-Chu (TW)

(73) Assignee: eMemory Technology Inc., Hsinchu (TW)

(*) Notice: Subject to any disclaimer, the term of this patent is extended or adjusted under 35 U.S.C. 154(b) by 0 days.

(21) Appl. No.: 12/125,912

(22) Filed: May 22, 2008

(65) Prior Publication Data

US 2008/0293199 A1    Nov. 27, 2008

Related U.S. Application Data

(62) Division of application No. 11/380,662, filed on Apr. 28, 2006, now abandoned.

(60) Provisional application No. 60/597,210, filed on Nov. 17, 2005.

(51) Int. Cl.
*G11C 7/00* (2006.01)

(52) U.S. Cl. .............................. 365/185.29; 365/185.18; 365/185.26

(58) Field of Classification Search ............ 365/185.29, 365/185.18, 185.26, 185.28, 185.15; 257/314–315, 257/324, E29.309, E21.423, E21.679
See application file for complete search history.

(56) References Cited

U.S. PATENT DOCUMENTS

| | | | |
|---|---|---|---|
| 5,216,268 A | 6/1993 | Chen | |
| 5,761,126 A | 6/1998 | Chi et al. | |
| 6,025,625 A | 2/2000 | Chi | |
| 6,721,205 B2 * | 4/2004 | Kobayashi et al. | ..... 365/185.26 |
| 6,816,414 B1 | 11/2004 | Prinz | |
| 6,862,251 B2 | 3/2005 | Yaoi | |
| 6,914,813 B2 | 7/2005 | Chevallier | |
| 6,922,363 B2 | 7/2005 | Hsu | |
| 6,930,002 B1 | 8/2005 | Chen et al. | |
| 6,972,997 B2 | 12/2005 | Ishimaru | |
| 6,982,906 B2 | 1/2006 | Matsuoka | |
| 7,006,378 B1 | 2/2006 | Saito | |

(Continued)

OTHER PUBLICATIONS

Ohnakado et al., "Novel Electron Injection Method Using Band-to-Band Tunneling Induced Hot Electron(BBHE) for Flash Memory with a P-Channel Cell," Dec. 1995. International Electron Devices Meeting. pp. 279-282.

(Continued)

*Primary Examiner*—David Lam
(74) *Attorney, Agent, or Firm*—Winston Hsu

(57) ABSTRACT

A single-poly, P-channel non-volatile memory cell that is fully compatible with nano-scale semiconductor manufacturing process is provided. The single-poly, P-channel non-volatile memory cell includes an N well, a gate formed on the N well, a gate dielectric layer between the gate and the N well, an ONO layer on sidewalls of the gate, a P+ source doping region and a P+ drain doping region. The ONO layer includes a first oxide layer deposited on the sidewalls of the gate and extends to the N well, and a silicon nitride layer formed on the first oxide layer. The silicon nitride layer functions as a charge-trapping layer.

8 Claims, 10 Drawing Sheets

U.S. PATENT DOCUMENTS

| | | |
|---|---|---|
| 2002/0153555 A1 | 10/2002 | Manabe |
| 2006/0289925 A1 | 12/2006 | Wong |
| 2007/0042544 A1 | 2/2007 | Wu |
| 2007/0108507 A1 | 5/2007 | Wang |
| 2007/0108508 A1 | 5/2007 | Lin |
| 2007/0109872 A1 | 5/2007 | Lin |
| 2007/0278556 A1 | 12/2007 | King |
| 2007/0297224 A1 | 12/2007 | King |

OTHER PUBLICATIONS

Lin et al., "New Divided-Source Structure to Eliminate Instability of Threshold Voltage in P-Channel Flash Memory Using Channel Hot-Hole-Induced-Hot-Electron Programming," 1999. International Symposium on VLSI Technology, Systems, and Applications. pp. 203-206.

Shen et al.,"Novel Self-Convergent Programming Scheme for Multi-Level P-Channel Flash Memory," Dec. 1997. International Electron Devices Meeting. pp. 287-290.

Ohnakado et al., "Device Characteristics of 0.35um P-Channel DINOR Flash Memory Using Band-to-Band Tunneling-Induced Hot Electron(BBHE) Programming," Sep. 1999. IEEE Transactions on Electron Devices, vol. 46, No. 9. pp. 1866-1871.

* cited by examiner

SINGLE-POLY NON-VOLATILE MEMORY DEVICE AND ITS OPERATION METHOD

CROSS REFERENCE TO RELATED APPLICATIONS

This application is a division of U.S. application Ser. No. 11/380,662 filed Apr. 28, 2006. This application also claims the benefit of U.S. provisional application No. 60/597,210 filed Nov. 17, 2005.

BACKGROUND OF THE INVENTION

1. Field of the Invention

The present invention relates generally to single-poly non-volatile memory (NVM) devices. More particularly, the present invention relates to single-poly electrical programmable read only memory (EPROM) devices, and program, read and erase methods for operating such device.

2. Description of the Prior Art

Non Volatile Memory (NVM) is arguably one of the most popular electronic storage mediums. The basic conception is the memory, which retains data stored to it when powered off. This memory family has several members (ROM, OTP, EPROM, EEPROM, flash) with varying degrees of flexibility of use differentiating them.

Depending on the times of program and erase operations of a memory, the NVM can be further cataloged into multi-time programmable memory (MTP memory) and one-time programmable memory (OTP memory).

MTP memory, such as EEPROM or flash memory, is repeatedly programmable to update data, and has specific circuits for erasing, programming, and reading operations. Unlike MTP memory, OTP memory is one-time programmable and has circuits for programming and reading operations without an erasing circuit, so the circuit for controlling the operations of the OTP memory is simpler than the circuit for controlling the operations of the MTP memory.

In order to expand the practical applications of the OTP memory, an erasing method used in EPROM (such as ultra-violet illumination) is attempted to erase data stored in OTP memory. In addition, a simple circuit is designed to control OTP memory and simulate updateable ability like MTP memory.

Traditionally, either an MTP memory cell or an OTP memory cell has a stacked structure, which is composed of a floating gate for storing electric charges, a control gate for controlling the charging of the floating gate, and an insulating layer (such as an ONO composite layer composed of an silicon oxide layer, a silicon nitride layer, and an silicon oxide layer) positioned between the floating gate and the control gate. Like a capacitor, the memory cell stores electric charges in the floating gate to get a different threshold voltage $V_{th}$ from the memory cell stores no electric charges in the floating gate, thus storing binary data such as 0 or 1.

The stacked gate structure of non-volatile memory makes the advanced logic process more complex and more costly because additional polysilicon deposition, thermal budget, and difficult lithograph and etching steps are involved. The thermal budget also affects the electrical property of the logic devices. Especially for most of the leading logic technologies, dozens of transistors performance will be changed due to the introduce of extra thermal budget. It is very hard to turn back to the original target one for the embedded nonvolatile memory process. And moreover, the re-adjustment of the logic devices may seriously delay the product developing time schedule.

For all worldwide semiconductor companies, a simple nonvolatile memory solution is desired in advanced logic process. No additional mask steps, no ultra high voltage operation, fully compatible to standard logic process are strongly requested and preferred. No additional mask step means that only logic transistors devices can be adopted to serve as a non-volatile memory device. No ultra high voltage operation means that extra high voltage device process and stacked floating gate non-volatile memory are excluded in the non-volatile memory candidates for advanced logic process nodes. Single poly non-volatile memory will be a more suitable NVM solution than the double poly stacked gate one in the advanced technology nodes.

On the other hand, many innovative inventions are directing the nonvolatile memory development to use the single poly solution. Single-poly non-volatile memory is regarded as a semiconductor process which is more compatible with standard CMOS processes and is thus more easier utilized in embedded memory such as mixed-mode circuits or embedded NVM memory of micro-controllers.

U.S. Pat. No. 5,761,126 describes a single poly EPROM cell that utilizes a reduced programming voltage to program the cell. The programming voltage of single-poly EPROM cell is reduced by eliminating the N+ contact region which is conventionally utilized to place a positive voltage on the N-well of the cell, and by utilizing a negative voltage to program the cell. The negative voltage is applied to a P+ contact region formed in the N-well which injects electrons directly onto the floating gate of the cell.

U.S. Pat. No. 6,930,002 describes a method for programming single-poly EPROM at low operation voltages. The single-poly EPROM cell includes a P-channel floating-gate transistor formed on an N well of a P type substrate, and an N-channel coupling device. The P-channel floating-gate transistor has a $P^+$ doped drain, $P^+$ doped source, a P channel defined between the $P^+$ doped drain and $P^+$ doped source, a tunnel oxide layer on the P channel, and a floating doped poly gate disposed on the tunnel oxide layer. The N-channel coupling device includes a floating poly electrode, which is electrically connected to the floating doped poly gate of the P-channel floating-gate transistor, and is capacitively coupled to a control region doped in the P type substrate.

U.S. Pat. No. 6,025,625 describes a single-poly EEPROM cell structure and array architecture. The single-poly EEPROM cell comprises an inverter and a capacitive coupling area. The inverter is formed by: a p-well formed in a substrate; a gate structure formed atop the p-well and being formed from a thin gate oxide layer underneath a conductive layer; an n-base formed adjacent to a first edge of the gate structure and within the p-well; a p+ structure formed within the n-base; and a n+ structure adjacent a second edge of the gate structure and within the p-well.

The above-described prior art single-poly floating gate non-volatile memory has several drawbacks. First, the prior art single-poly floating gate non-volatile memory unit occupies larger chip area. Hitherto, the miniaturization of single-poly floating gate non-volatile memory unit for advanced 90-nano or below semiconductor process is still a huge challenge for the semiconductor manufacturers.

With the moving to next generation of the logic process, both the operation voltages and gate oxide thickness shrink. For example, the thickness of the gate oxide ranges between 50 and 60 angstroms for I/O transistors in 90-nano processes. The shrunk gate oxide thickness impedes the development of the floating gate based single-poly MTP memory because thin tunnel oxide will affect long term charge retention, while increasing tunnel oxide thickness is not compatible with logic process. The tunneling oxide with the physical oxide thickness larger than 70 angstroms is regarded as a basic requirement for the long term charge retention reliability in the floating gate non-volatile memory devices.

Conventional methods for programming the single-poly floating gate EPROM are operated at voltages that are relatively higher than Vcc (3.3V input/output supply voltage in 90 nm logic process), for example, a high couple well voltage of about at least 8~10V that is high enough to establish adequate electric field strength across the tunnel oxide. Thus, additional high-voltage circuitry and high-voltage devices are required. Operating at high voltages also adversely affects the reliability of thin gate dielectric having a thickness of 50~60 angstroms in the peripheral logic transistors if we don't want to introduce additional high voltage processes. Further, conventional single-poly floating gate EPROM technology needs a large cell size and a high voltage to capacitively couple the floating gate for programming the memory cell.

Therefore, the key to a successful next generation non-volatile memory device will rely on the low voltage operation and adoption of an innovative idea instead of floating gate technologies.

SUMMARY OF THE INVENTION

It is one object of the present invention to provide a single-poly, P-channel non-volatile memory unit that is compatible with advanced nano-scale semiconductor process.

It is another object of the present invention to provide a single-poly electrically erasable programmable read-only memory (EEPROM) device and program, read and erase methods for operating such device in order to solve the above-described problems.

The claimed invention discloses a single-poly, P-channel non-volatile memory unit comprising a semiconductor substrate; an N well formed in the semiconductor substrate, wherein a P+ source doping region and a P+ drain doping region are formed in the N well, a channel between the P+ source doping region and P+ drain doping region comprises a first channel region and a second channel region contiguous to the first channel region and same conductivity type as first channel region; a gate dielectric layer disposed only on the first channel region; a control gate stacked on the gate dielectric layer; and a dielectric spacer comprising a floating charge trapping medium disposed on sidewalls of the control gate, wherein the charge trapping medium is situated directly above the second channel region, and the second channel region can be turned on or turned off by altering charge distribution in the charge trapping medium.

From one aspect of this invention, a method for programming the single-poly, P-channel non-volatile memory unit is disclosed. The method comprises connecting the N well to a N well voltage $V_{NW}$; connecting the P+ drain doping region to a bias drain voltage $V_D$ being negative with respect to the N well voltage $V_{NW}$; floating the P+ source doping region; and connecting the control gate to a bias gate voltage $V_G$ being equal to or positive with respect to the N well voltage $V_{NW}$ such that the first channel is turned off and that electron-hole pairs is generated at a junction between the N well and the P+ drain doping region to induce Band-to-Band Hot Electron Injection (BBHE) into the charge trapping medium.

From another aspect of this invention, a method for programming the single-poly, P-channel non-volatile memory unit is disclosed. The method comprises connecting the N well to a N well voltage $V_{NW}$; connecting the P+ drain doping region to a bias drain voltage $V_D$ being negative with respect to the N well voltage $V_{NW}$; connecting the P+ source doping region to a source voltage $V_S$; and connecting the control gate to a bias gate voltage $V_G$ being negative with respect to the N well voltage $V_{NW}$ such that the first channel is turned on to trigger channel hot hole induced hot electron (CHHIHE) injection into the charge trapping medium.

From still another aspect of this invention, a method for reading the single-poly, P-channel non-volatile memory unit is disclosed. The method comprises connecting the N well to a N well voltage $V_{NW}$; connecting the P+ drain doping region to a drain voltage $V_D$; connecting the P+ source doping region to a bias source voltage $V_S$ being negative with respect to the N well voltage $V_{NW}$ to form a depletion region between the P+ source doping region and the N well; and connecting the control gate to a bias gate voltage $V_G$ being negative with respect to the N well voltage $V_{NW}$ such that the first channel is turned on.

From still another aspect of this invention, a method for erasing a single-poly, P-channel non-volatile memory unit is disclosed. The single-poly, P-channel non-volatile memory unit comprises an N well, a P+ source doping region, a P+ drain doping region in the N well, a P channel between the P+ source doping region and P+ drain doping region, the P channel comprising a first channel region and a second channel region that is contiguous to the first channel region and is of the same conductivity type as said first channel region; a gate dielectric layer disposed only on the first channel region; a control gate stacked on the gate dielectric layer; and a dielectric spacer comprising a floating charge trapping medium disposed on sidewalls of the control gate, wherein said charge trapping medium is situated directly above said second channel region. The method comprises connecting the P+ drain doping region to a relatively positive drain voltage $V_D$; floating the P+ source doping region; connecting the N well to a bias voltage $V_{NW}$ being equal to the drain voltage $V_D$ or floating the N well; and connecting the control gate to a relatively negative gate voltage $V_G$ such that electrons trapped in the charge trapping medium are erased by means of Fowler-Nordheim tunneling (FN tunneling).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention pertains to a single-poly, P-channel non-volatile memory (NVM) cell structure that is fully compatible with nano-scale semiconductor manufacturing process beyond the advanced 90-nano logic processes. The operation methods thereof are also provided.

In many 0.18-micron logic processes, oxide-nitride-oxide (ONO) composite dielectric film is used as a spacer. This is mostly because the ONO layers can avoid gate-to-source/drain bridging after salicidation due to the adoption of the nitride ($Si_3N_4$) composites, and because the ONO layers can be used as a contact etch stop during contact hole etching thereby solving the potential misalignment problem between the gate poly mask and contact hole mask.

The ONO composite dielectric film not only plays an important role in the logic processes, but also becomes a promising charge storage layer of a non-volatile memory. The nitride ($Si_3N_4$) film contains a large volume of trapping sites which are believed to be generated by the dangling bonds for the imperfect combination of Si and nitrogen atoms. The trapping sites can retain or release the electrons by suitable electrical operations. By altering the charge amount in the ONO layer, the conductance of the underlying channel can be properly adjusted, thereby distinguishing logic 0 or 1. This approach is commonly used in so-called Semiconductor-Oxide-Nitride-Oxide-Semiconductor (SONOS) or Metal-Oxide-Nitride-Oxide-Semiconductor (MONOS) technology. However, the ONO layer is typically used as gate dielectric of the non-volatile memory and is thus not so compatible with standard logic process.

Figure 1:
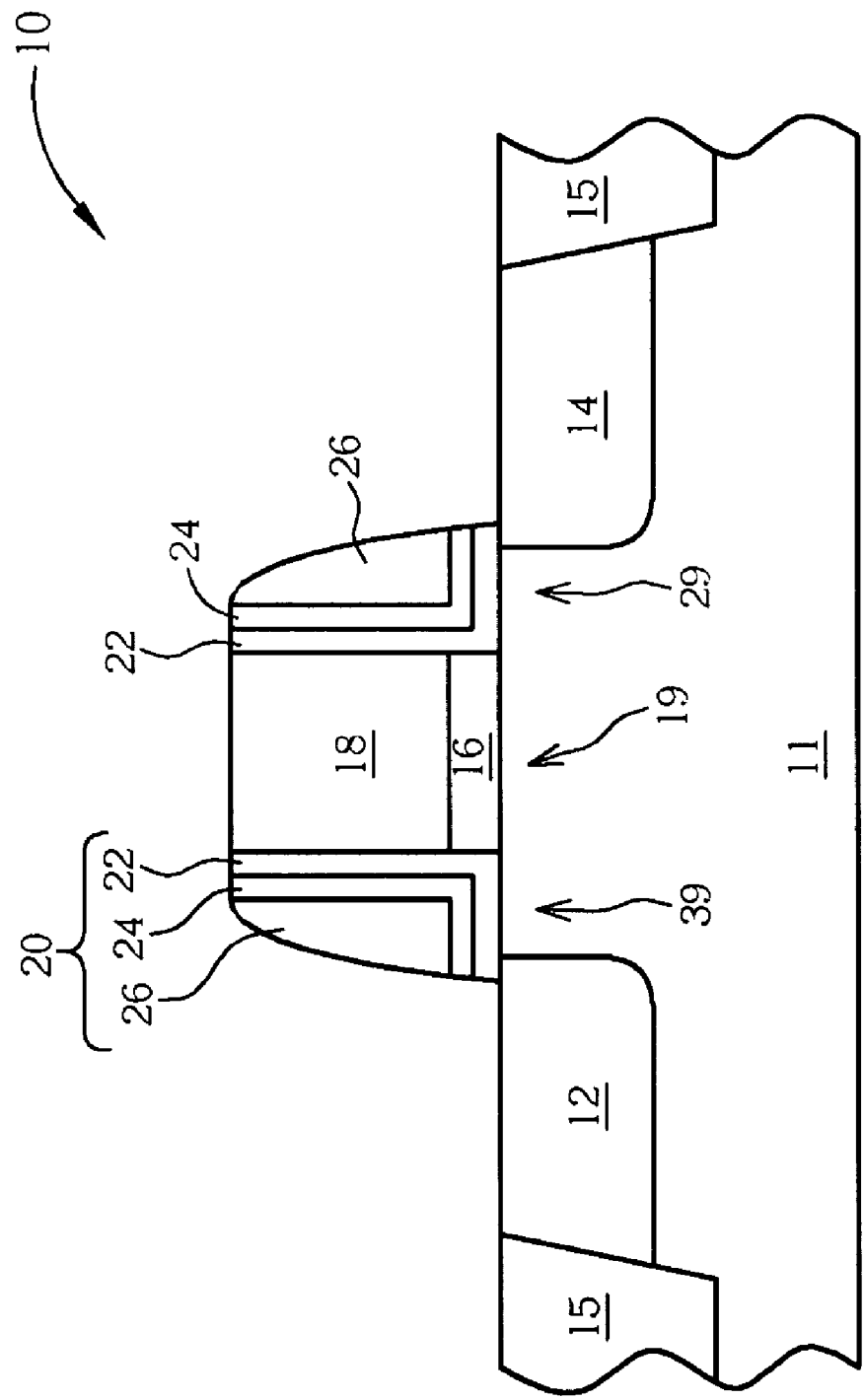
FIG. 1 is a schematic, cross-sectional diagram illustrating a single-poly nonvolatile memory unit according to the preferred embodiment of this invention.

Please refer to FIG. 1. FIG. 1 is a schematic, cross-sectional diagram illustrating a single-poly nonvolatile memory unit according to the preferred embodiment of this invention. As shown in FIG. 1, the single-poly nonvolatile memory unit 10 comprises an N well substrate 11, a conductive (P+ doped) gate 18 disposed on the N well substrate 11, a gate dielectric layer 16 between the gate 18 and the N well substrate 11, an oxide-nitride-oxide (ONO) spacer 20 on sidewalls of the gate 18, a P+ source doping region 12 implanted into the N well substrate 11 next to the ONO layers 20, and a P+ drain doping region 14 implanted into the N well substrate 11 next to the ONO layers 20. The single-poly nonvolatile memory unit 10 is isolated with a shallow trench isolation (STI) structure 15. A first channel 19 is situated directly underneath the gate 18.

A second channel 29 is defined between the gate 18 and the P+ drain doping region 14. A third channel 39 is defined between the gate 18 and the P+ source doping region 12.

According to the preferred embodiment of this invention, the ONO layer 20 comprises a silicon oxide layer 22, a silicon nitride layer 24 and a silicon oxide layer 26. The silicon oxide layer 22 is the inner layer and directly borders the sidewalls of the gate 18 and its lower portion extends laterally to the source or drain doping region 12/14 on the N well substrate 11. Preferably, the silicon oxide layer 22 has a thickness of about 30~300 angstroms. The silicon nitride layer 24 has a thickness of about 50~500 angstroms. The silicon nitride layer 24 acts as a charge-trapping layer or charge-trapping medium for storing data. The gate dielectric layer 16 may be made of silicon dioxide, but not limited thereto. The gate may be made of polysilicon, doped polysilicon, or any suitable conductive materials such as metals. On the top of the gate 18, and/or on the top surface of the source/drain doping regions 12 and 14, a silicide layer (not shown) may be formed in order to reduce contact resistance.

As previously described, the single-poly nonvolatile memory unit 10 is a P-channel MOS transistor. It is one salient feature of this invention that electrons are stored in the ONO layers 20 on the sidewalls of the gate 18. Besides, the single-poly nonvolatile memory unit 10 of this invention has no lightly doped drain (LDD) that is typically formed in a logic device for alleviating short channel effects. A pure logic device without LDD region will always turn off because an isolated NW region that is under the sidewall and cannot be controlled by the gate will form and retard the channel to be further turn on.

The program, read and erase methods for operating the single-poly nonvolatile memory unit 10 at low voltages will now be explained in detail in accompany with FIGS. 2-9. It should be noted that the exemplary voltages used in the embodiments are only for illustration purposes and should not limit the scope of the present invention. The exemplary voltages used in the preferred embodiments are basically suited for device of 0.13-micron generation. It is understood that different operating voltages may be employed when different generations of fabrication processes are used.

Figure 2:
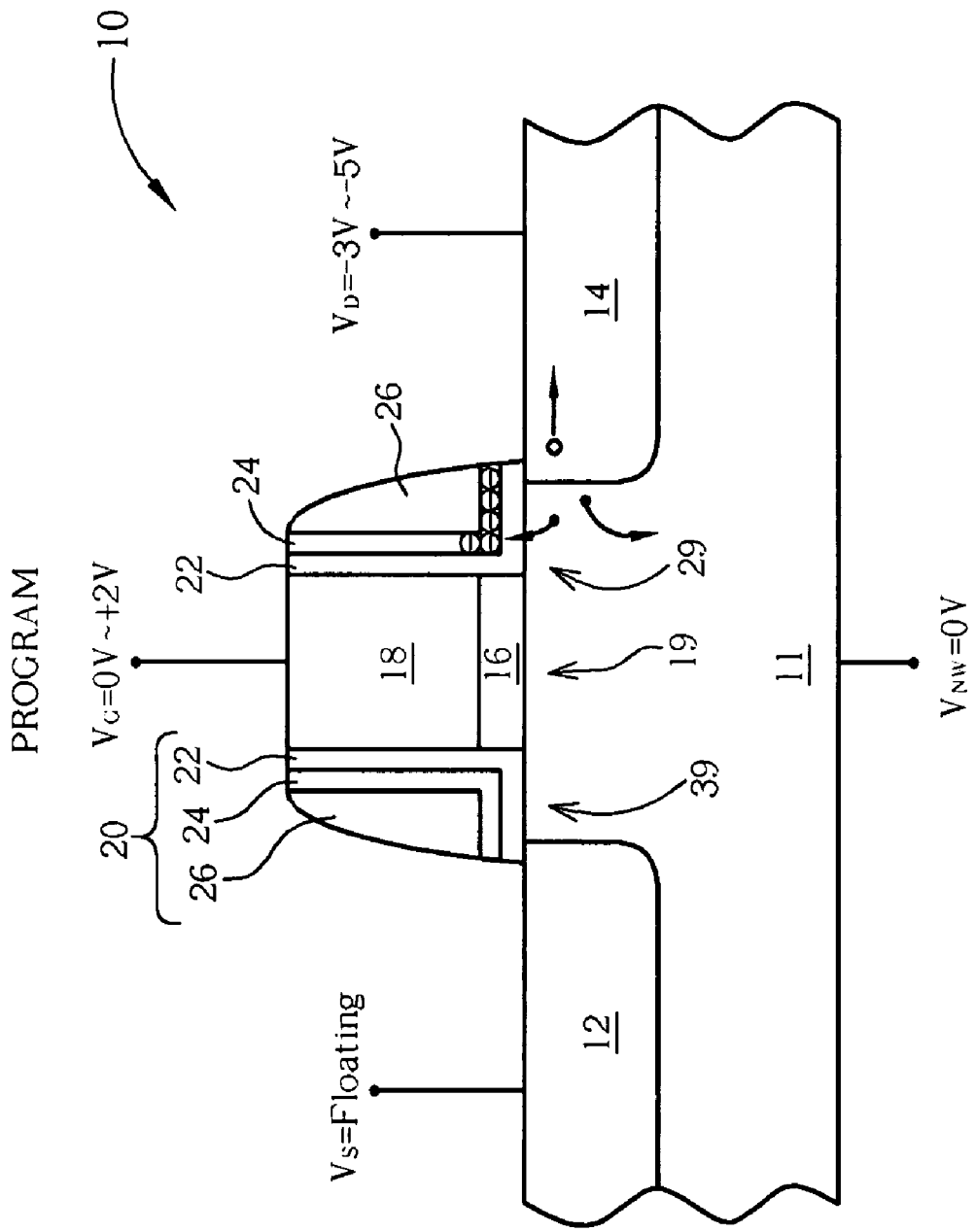
FIG. 2 is a schematic, cross-sectional diagram illustrating program operation of the single-poly nonvolatile memory unit according to the preferred embodiment of this invention.

Please refer to FIG. 2. FIG. 2 is a schematic, cross-sectional diagram illustrating program operation of the single-poly nonvolatile memory unit 10 according to the preferred embodiment of this invention. When the single-poly nonvolatile memory unit 10 is selected to perform write or program operation, the P+ drain doping region 14 (to bit line) is connected to a negative drain voltage $V_D$, for example, $V_D = -3V \sim -5V$; the P+ source doping region 12 (to source line) is floating; the N well substrate 11 grounded ($V_{NW} = 0V$); and the gate 18 (to word line) is connected to a gate voltage $V_G$, for example, $V_G = 0V \sim 2V$. Under the above-described operating voltage conditions, the first channel 19 directly under the gate 18 is turned off. Electron-hole pairs generate at the junction between the N-type well 111 and the P-type drain doping region 14 and so-called Band-to-Band Hot Electron Injection (BBHE) occurs to inject electrons into the silicon nitride layer 24 of the ONO layers 20 near the drain side.

According to another preferred embodiment, the program operation of the single-poly nonvolatile memory unit 10 may be carried out by means of so-called Channel Hot Hole Induced Hot Electron Injection (CHHIHE) mechanism. For example, the P+ drain doping region 14 is connected to a negative drain voltage $V_D$, for example, $V_D = -3V \sim -5V$; the P+ source doping region 12 and the N well substrate 11 are both grounded ($V_S = V_{NW} = 0V$); and the gate 18 is connected to a slightly negative gate voltage $V_G$, for example, $V_G = -$ 0.5V~–2V. Under the above-described operating voltage conditions, the first channel 19 directly under the gate 18 is turned on. Hot electrons induced by channel hot holes will inject into the silicon nitride layer 24 of the ONO layers 20 near the drain side.

Although two mechanisms: BBHE and CHHIHE are provided, the BBHE mechanism is more preferred because it consumes less electric current and is more efficient, in other words, it is a more energy-saving mechanism. Besides, there is a risk when employing CHHIHE to program the memory unit 10, that is, drain-source punchthrough may occur. In order to improve the efficiency of the BBHE program operation, a more abrupt junction profile between the N-type well 111 and the P-type drain doping region 14 is suggested. By doing this, a lower $V_D$ may be used.

Figure 3:
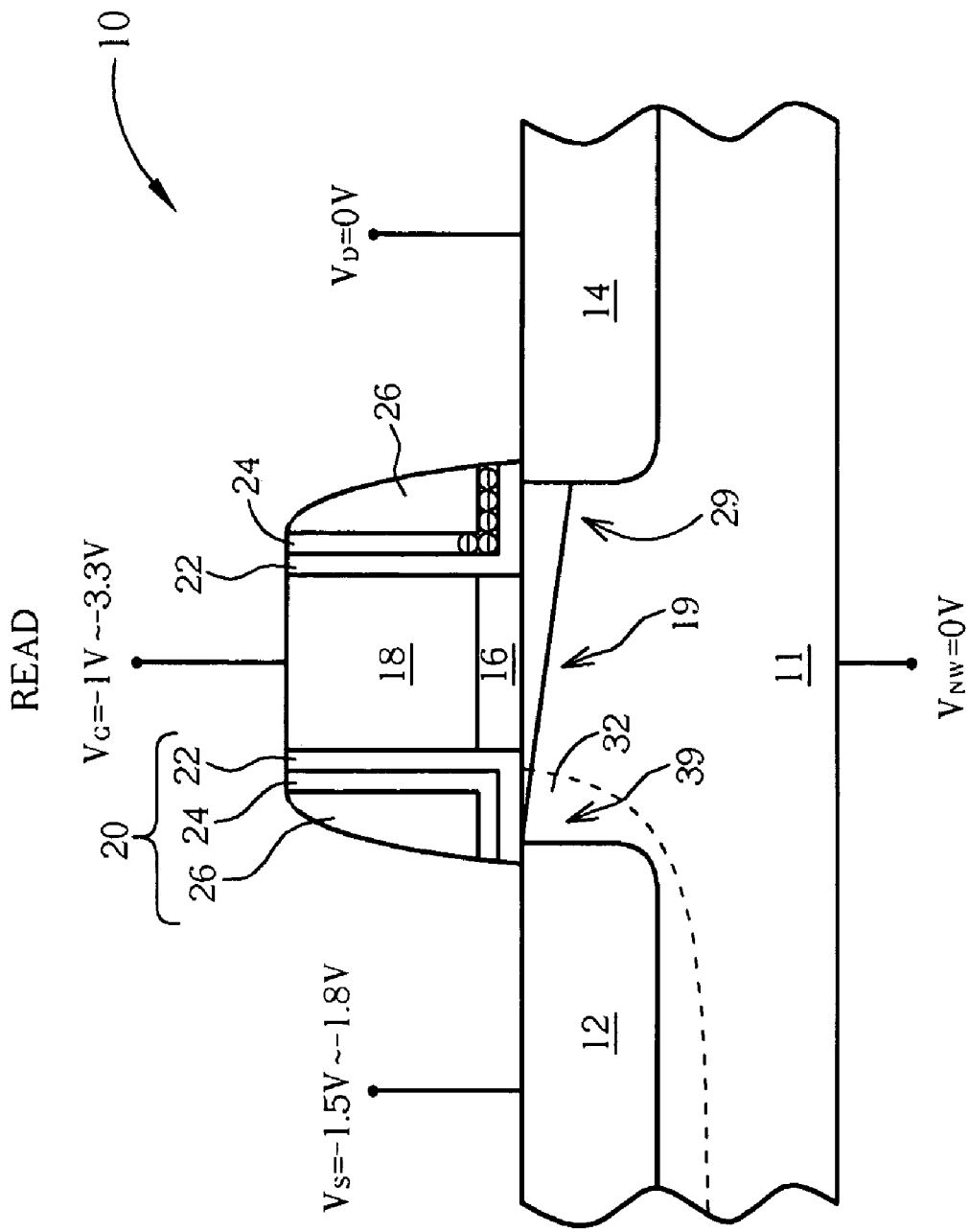
FIG. 3 is a schematic, cross-sectional diagram illustrating read operation of the single-poly nonvolatile memory unit according to the preferred embodiment of this invention.

Please refer to FIG. 3. FIG. 3 is a schematic, cross-sectional diagram illustrating read operation of the single-poly nonvolatile memory unit 10 according to the preferred embodiment of this invention. It is one important feature of this invention that the read operation employs "reverse-read". That is, grounding the drain terminal, and applying negative voltage to the source terminal. According to the preferred embodiment, when the single-poly nonvolatile memory unit 10 is selected to perform read operation, the P+ drain doping region 14 is connected to a drain voltage $V_D$=0V; the P+ source doping region 12 is connected to a negative source voltage $V_S$=–1.5V~–1.8V; the N well substrate 111 grounded ($V_{NW}$=0V); and the gate 18 is connected to a negative gate voltage $V_G$=–1V~–3.3V. Under the above-described voltage conditions, the first channel 19 directly under the gate 18 and the third channel 39 between the gate 18 and the P+ source doping region 12 are both turned on.

It should noted that since the single-poly nonvolatile memory unit 10 has no LDDs, a sufficiently negative $V_S$ is required in order to turn on the third channel 39 between the gate 18 and the P+ source doping region 12 such that a depletion region 32 is able to connect with the inversion region, i.e., the turned-on first channel 19. As to the second channel 29, the conductance of the second channel 29 will depend on that if the ONO layers on the second channel 29 stores electrons or not. If the ONO layers on the second channel 29 stores electrons, the second channel 29 will be inversed and become a conductive path for read signals. If not, the second channel 29 will not become conductive. Accordingly, during the read operation, the conductance of the NVM memory device depends mostly on whether the ONO layers on the second channel 29 stores electrons.

Figure 4:
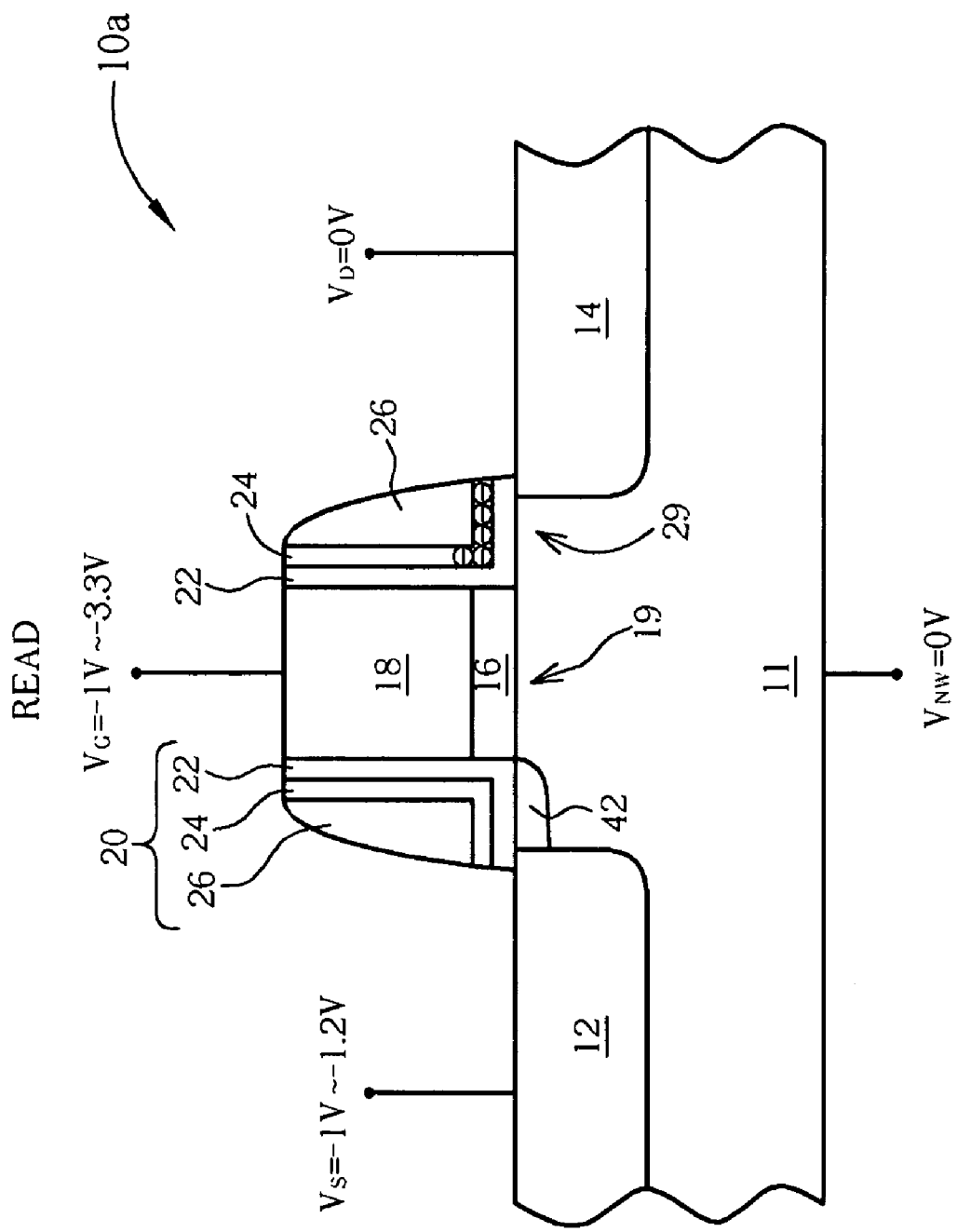
FIG. 4 is a schematic, cross-sectional diagram illustrating read operation of the single-poly nonvolatile memory unit according to another preferred embodiment of this invention.

Please refer to FIG. 4. FIG. 4 is a schematic, cross-sectional diagram illustrating read operation of the single-poly nonvolatile memory unit 10a according to another preferred embodiment of this invention. The only difference between FIG. 3 and FIG. 4 is that the single-poly nonvolatile memory unit 10a of FIG. 4 has an asymmetric LDD 42 that is implanted into the area between the gate 18 and the P+ source doping region 12. According to this preferred embodiment, when the single-poly nonvolatile memory unit 10a is selected to perform read operation, the P+ drain doping region 14 is connected to a drain voltage $V_D$=0V; the P+ source doping region 12 is connected to a negative source voltage $V_S$=–1V~–1.2V; the N well substrate 11 grounded ($V_{NW}$=0V); and the gate 18 is connected to a negative gate voltage $V_G$=–1V~–3.3V. Under the above-described voltage conditions, the first channel 19 directly under the gate 18 is turned on. Because the single-poly nonvolatile memory unit 10a has the LDD 42 at its source side, a slightly higher (or more positive) source voltage $V_S$ can be employed.

Figure 5:
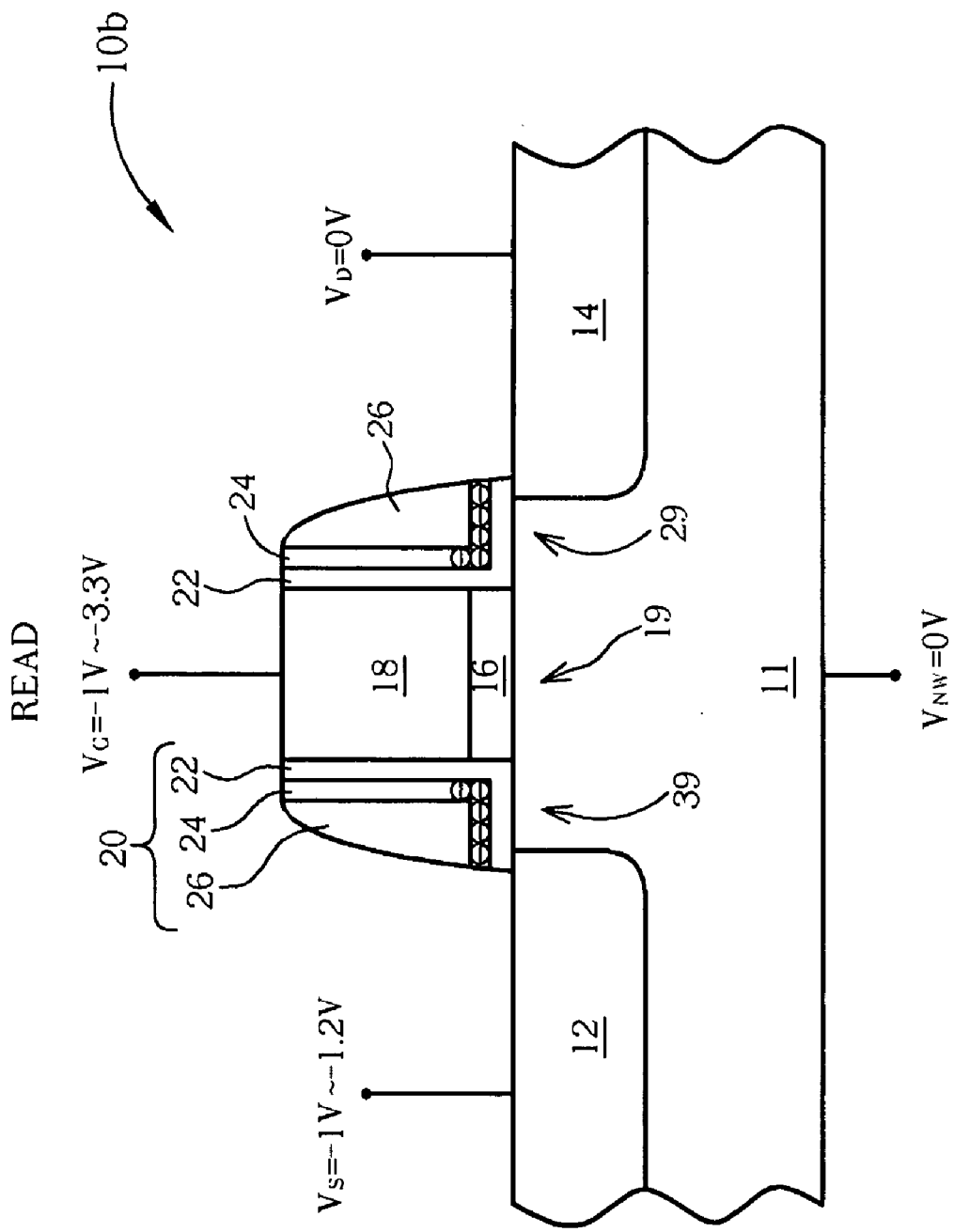
FIG. 5 is a schematic, cross-sectional diagram illustrating read operation of the single-poly nonvolatile memory unit according to still another preferred embodiment of this invention.

Please refer to FIG. 5. FIG. 5 is a schematic, cross-sectional diagram illustrating read operation of the single-poly nonvolatile memory unit 10b according to still another preferred embodiment of this invention. The only difference between FIG. 3 and FIG. 5 is that electrons are injected into the ONO layers above the third channel 39 near the source side of every single-poly nonvolatile memory unit in advance. According to this preferred embodiment, when the single-poly nonvolatile memory unit 10b is selected to perform read operation, the P+ drain doping region 14 is connected to a drain voltage $V_D$=0V; the P+ source doping region 12 is connected to a negative source voltage $V_S$=–1V~–1.2V; the N well substrate 11 grounded ($V_{NW}$=0V); and the gate 18 is connected to a negative gate voltage $V_G$=–1V~–3.3V. Likewise, during this read operation, the conductance of the memory device depends on whether the ONO layers on the second channel 29 stores electrons.

The erase methods for operating the single-poly nonvolatile memory unit 10 at low voltages and erase mechanisms thereof will now be explained in detail in accompany with FIGS. 6-9. It should be noted that the exemplary voltages used in the embodiments are only for illustration purposes and should not limit the scope of the present invention. In practice, each of the exemplary voltages used in the preferred embodiments may be shifted together by a positive voltage value or together by a negative voltage value, while maintaining the same biases. For example, a voltage condition including a drain voltage of –3V and substrate voltage of 0V may be replaced with a voltage condition including a positively shifted drain voltage of 0V and substrate voltage of 3V, maintaining the drain to substrate voltage difference to be –3V in both proposed biasing settings.

Figure 6:
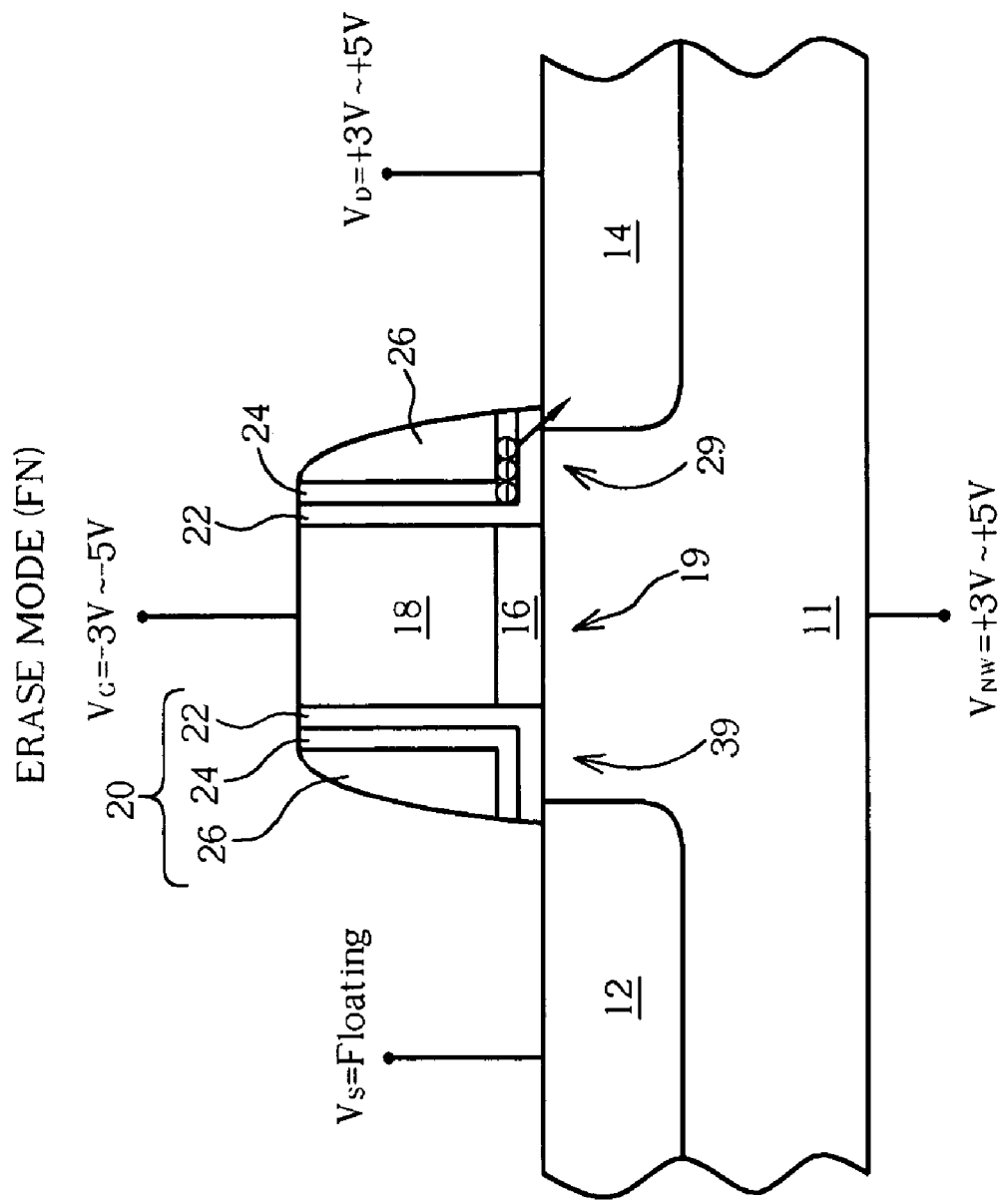
FIG. 6 is a schematic, cross-sectional diagram illustrating erase operation of the single-poly nonvolatile memory unit according to the preferred embodiment of this invention.

Please refer to FIG. 6. FIG. 6 is a schematic, cross-sectional diagram illustrating erase operation of the single-poly nonvolatile memory unit 10 according to this invention. Such erase method is applicable to the single-poly nonvolatile memory unit 10 that is used as a MTP memory. According to this invention, when the single-poly nonvolatile memory unit 10 is selected to perform erase operation, the P+ drain doping region 14 is connected to a positive drain voltage $V_D$=3V~5V; the P+ source doping region 12 is floating ($V_S$=Floating); the N well substrate 11 is connected to a positive N well voltage $V_{NW}$=3V~5V; and the gate 18 is connected to a negative gate voltage $V_G$=–3V~–5V. Under the above-described voltage conditions, the trapped electrons in the silicon nitride layer 24 of the ONO layers 20 are erased by means of so-called Fowler-Nordheim tunneling (FN tunneling).

Figure 7:
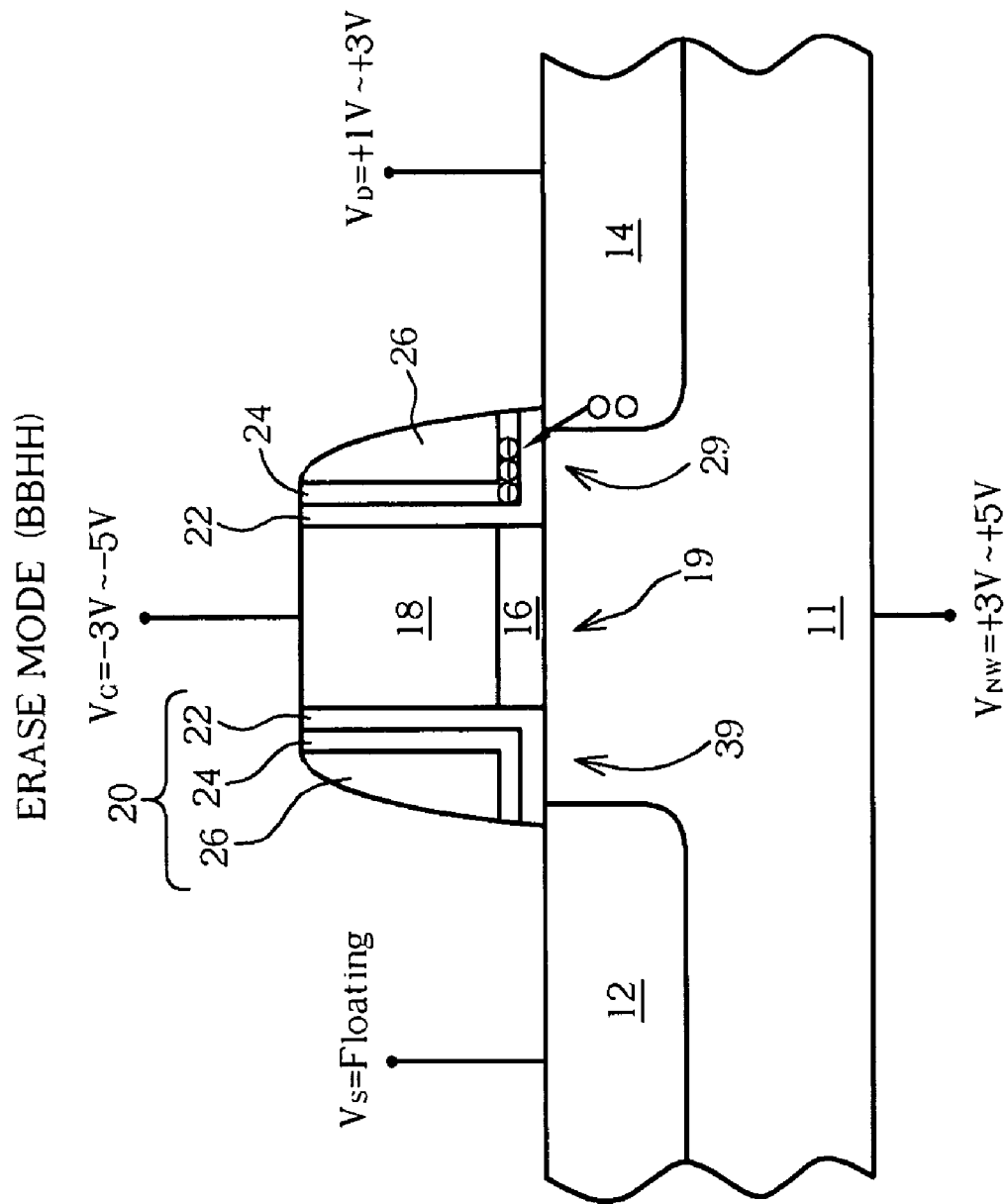
FIG. 7 is a schematic, cross-sectional diagram illustrating erase operation of the single-poly nonvolatile memory unit according to another preferred embodiment of this invention.

According to another preferred embodiment, the erase operation of the single-poly nonvolatile memory unit 10 may be carried out by means of so-called Band-to-Band induced Hot Hole injection (BBHH) mechanism. As shown in FIG. 7, the P+ drain doping region 14 is connected to a positive drain voltage $V_D$, for example, $V_D$=+1V~+3V; the P+ source doping region 12 is floating ($V_S$=Floating); the N well substrate 11 is connected to a well voltage that is greater than drain voltage $V_D$ (preferably +3V~+5V); and the gate 18 is connected to a negative gate voltage $V_G$, for example, $V_G$=–3V~–5V. Under the above-described operating voltage conditions, the electron hole pairs will be created due to the large bias difference between the gate to drain terminals. More electron hole pairs will be generated when holes flow through the junction between drain to well and get sufficient energy to introduce the impact ionizations. The trapped electrons in the silicon nitride layer 24 of the ONO layers 20 are erased by the injected hot holes into the charge storage medium.

Figure 8:
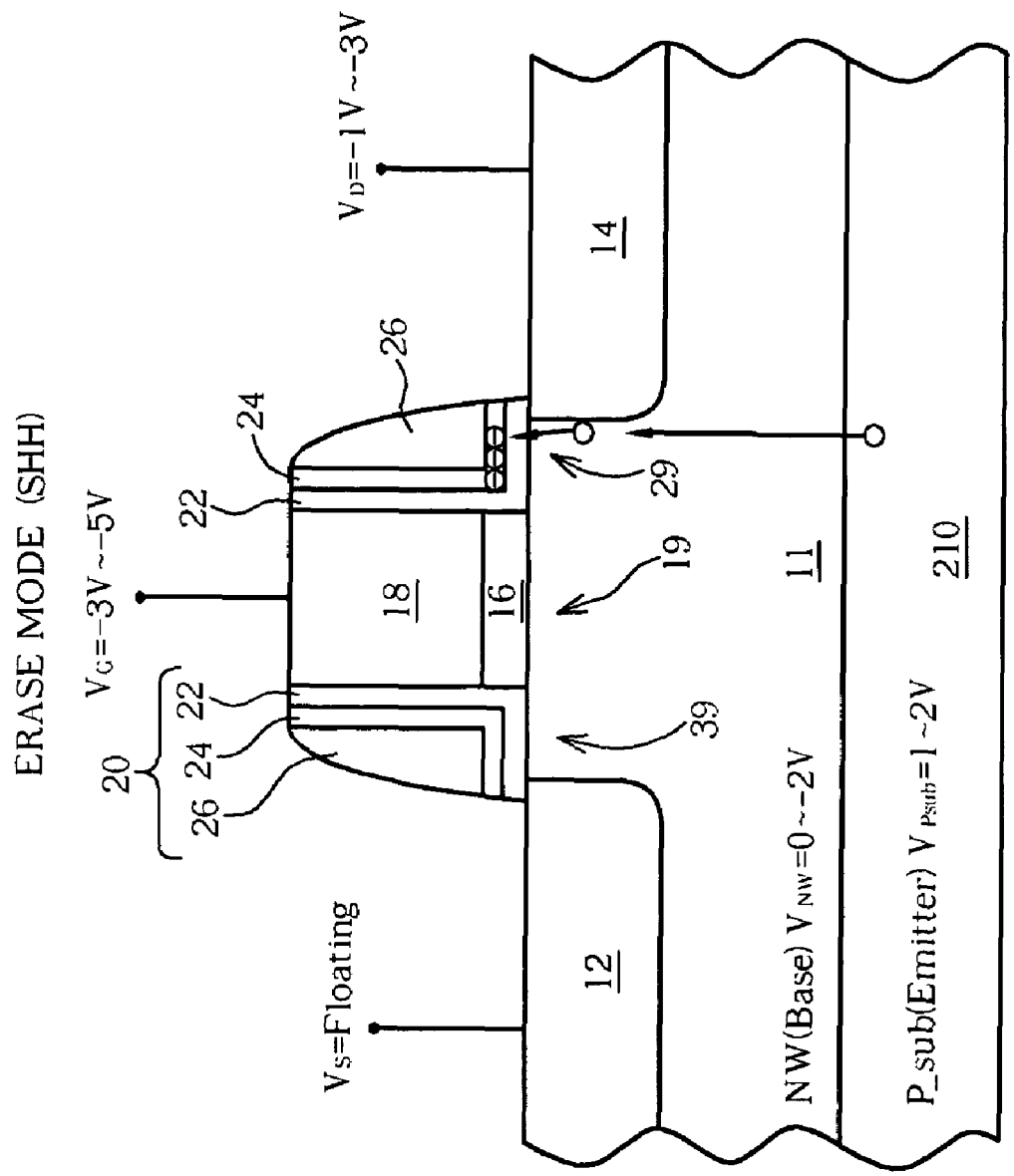
FIG. 8 is a schematic, cross-sectional diagram illustrating erase operation of the single-poly nonvolatile memory unit according to another preferred embodiment of this invention.

According to still another preferred embodiment, the erase operation of the single-poly nonvolatile memory unit 10 may be carried out by means of so-called Substrate Hot Hole injection (SHH) mechanism. As shown in FIG. 8, the P+ drain doping region 14 is floating or connected to a negative drain voltage $V_D$, for example, $V_D = -1V \sim -3V$; the P+ source doping region 12 is floating ($V_S$=Floating); the N well substrate 11 (acting as a base) is connected to a well voltage that is equal to or smaller than 0V ($V_{NW} \leq 0V$, preferably 0V~2V) but still maintaining a reverse biasing between the P+ drain doping region 14 and the N well substrate 11; a P substrate 210 (acting as emitter) underneath the N well 11 is connected to a positive substrate voltage $V_{Psub}$, for example, $V_{Psub}$=1V~2V; and the gate 18 is connected to a negative gate voltage $V_G$, for example, $V_G$=−3V~−5V to attract adequate hot holes from the P substrate 210 to move toward the ONO spacer 20. Since the gate voltage is negative, an inverse layer is established at the P channel and thus forms a collector. Under the above-described operating voltage conditions, the trapped electrons in the silicon nitride layer 24 of the ONO layers 20 are erased by Substrate Hot Hole injection.

Figure 9:
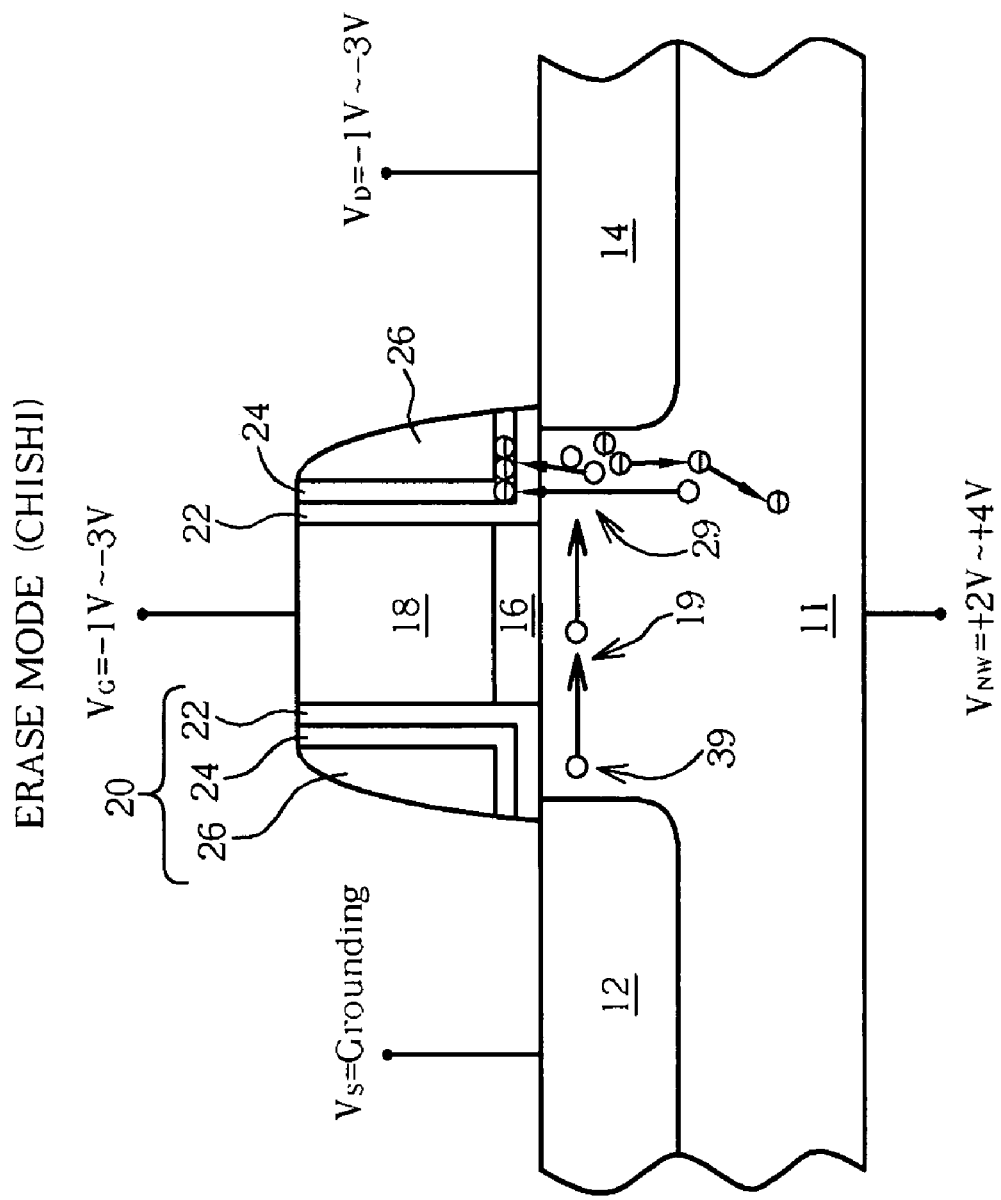
FIG. 9 is a schematic, cross-sectional diagram illustrating erase operation of the single-poly nonvolatile memory unit according to another preferred embodiment of this invention.

According to still another preferred embodiment, the erase operation of the single-poly nonvolatile memory unit 10 may be carried out by means of CHannel Induced Secondary Hole Injection (CHISHI) mechanism. As shown in FIG. 9, the P+ drain doping region 14 is connected to a negative drain voltage $V_D$, for example, $V_D$=−1V~−3V; the P+ source doping region 12 is grounded; the N well substrate 11 is connected to a positive well voltage, for example, $V_{NW}$=2V~4V; and the gate 18 is connected to a negative gate voltage $V_G$, for example, $V_G$=−1V~−3V. Under the above-described operating voltage conditions, electron hole pairs is generated due to the electric field established by the N well and the P+ drain doping region 14, wherein the generated hot holes are repelled by the positive voltage of the N well 11 and move toward the gate direction, and a portion of the generated electrons are attracted by the positive voltage of the N well 11 and thus move toward the N well. Besides, a secondary impact may occur at the mid way when the hot electrons move toward the N well and generates new electron hole pairs. The trapped electrons in the silicon nitride layer 24 of the ONO layers 20 are erased by the injected hot holes.

Figure 10:
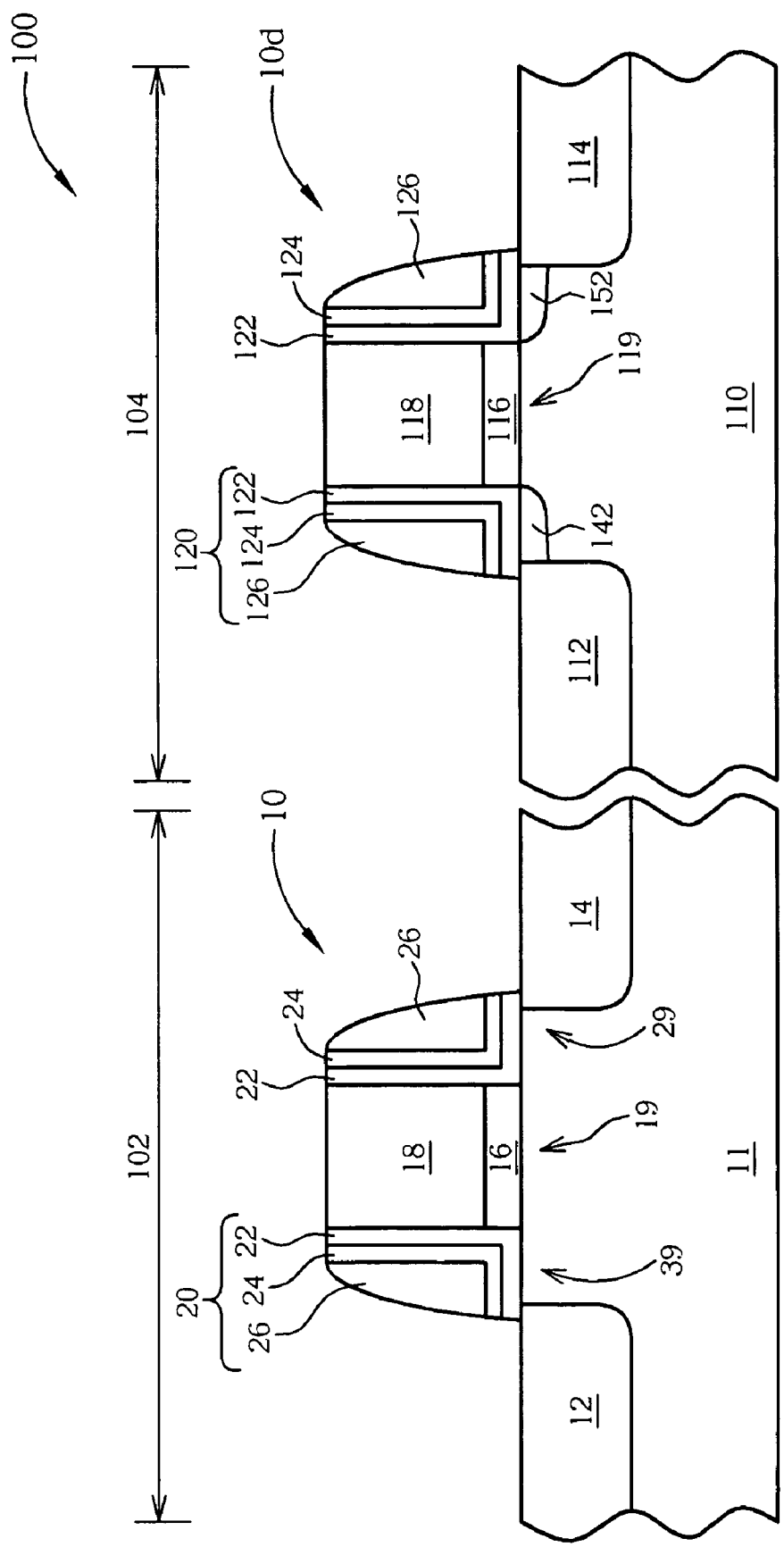
FIG. 10 is a schematic, cross-sectional diagram illustrating a chip having at least one logic device in logic device area and embedded single-poly nonvolatile memory unit in memory array area according to this invention.

Please refer to FIG. 10. FIG. 10 is a schematic, cross-sectional diagram illustrating a chip 100 having at least one logic device 10d in logic device area 104 and embedded single-poly nonvolatile memory unit 10 in memory array area 102 according to this invention. As shown in FIG. 10, the chip 100 comprises a memory array area 102 and a logic device area 104. At least one single-poly nonvolatile memory unit 10 is provided in the memory array area 102. The single-poly nonvolatile memory unit 10 is a PMOS transistor memory unit and has the same structure as set forth in FIG. 1. The single-poly nonvolatile memory unit 10 comprises an N well substrate 11, a conductive gate 18 disposed on the N well substrate 11, a gate dielectric layer 16 between the gate 18 and the N well substrate 11, an oxide-nitride-oxide (ONO) spacer 20 on sidewalls of the gate 18, a P+ source doping region 12 implanted into the N well substrate 11 next to the ONO layers 20, and a P+ drain doping region 14 implanted into the N well substrate 11 next to the ONO layers 20. A first channel 19 is situated directly underneath the gate 18. A second channel 29 is defined between the gate 18 and the P+ drain doping region 14. A third channel 39 is defined between the gate 18 and the P+ source doping region 12. The preferred exemplary program, read and erase methods for operating the device 10 are depicted in FIGS. 2, 3 and 6 respectively.

A logic device 10d is provided in the logic device area 104. The logic device 10d is a transistor device and may be an NMOS or PMOS. Likewise, the logic device 10d comprises a substrate 110, a conductive gate 118 disposed on the substrate 110, a gate dielectric layer 116 between the gate 118 and the substrate 110, an oxide-nitride-oxide (ONO) spacer 120 on sidewalls of the gate 118, a source doping region 112 implanted into the substrate 110 next to the ONO layers 120, and a drain doping region 114 implanted into the substrate 110 next to the ONO layers 120. Directly underneath the gate 118, a channel 119 is defined between a LDD doping region 142 and a LDD doping region 152. The single-poly nonvolatile memory unit 10 does not have LDD doping region.

Further, the single-poly nonvolatile memory unit 10 in the memory array area 102 can be replaced with single-poly nonvolatile memory unit 10a as set forth in FIG. 4 or with single-poly nonvolatile memory unit 10b as set forth in FIG. 5. In a case that the single-poly nonvolatile memory unit 10 in the memory array area 102 is replaced with single-poly nonvolatile memory unit 10a as set forth in FIG. 4, the memory array area 102 has asymmetric LDD doping. As previously described, the single-poly nonvolatile memory unit 10a has only one LDD doping region formed near its source side. In a case that the single-poly nonvolatile memory unit 10 in the memory array area 102 is replaced with single-poly nonvolatile memory unit 10b as set forth in FIG. 5, a program operation is carried to inject electrons into the ONO layers of source side of each single-poly nonvolatile memory unit 10b of the chip 100 prior to the shipping to the customer.

To sum up, the present invention comprises at least the following advantages:

(1) The present invention memory structure is fully compatible with nano-scale semiconductor fabrication processes because all nano-scale (ex. 90 nm, 65 nm or 45 nm) semiconductor devices use ONO layers on gate sidewall.

(2) It is cost saving because no additional photo masks are required.

(3) The present invention memory structure is applicable to both MTP and OTP.

(4) The present invention memory unit is very small in size.

(5) The present invention memory unit is power saving because BBHE mechanism is employed during program operation. The program voltage and write current are both reduced.

(6) The present invention memory structure is applicable to dual bit storage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for erasing a single-poly, P-channel non-volatile memory unit, wherein the single-poly, P-channel non-volatile memory unit comprises an N well, a P+ source doping region, a P+ drain doping region in the N well, a P channel between the P+ source doping region and P+ drain doping region, the P channel comprising a first channel region and a second channel region that is contiguous to the first channel region and is of the same conductivity type as said first channel region; a gate dielectric layer disposed only on the first channel region; a control gate stacked on the gate dielectric layer; and a dielectric spacer comprising a floating charge trapping medium disposed on sidewalls of the control gate, wherein said charge trapping medium is situated directly above said second channel region; the method comprising:

grounding the source doping region $V_S$ connecting the drain doping region to a drain voltage $V_D$ being negative with respect to the source voltage $V_S$;

connecting the N well to a N well voltage $V_{NW}$ being positive with respect to the source voltage $V_S$; and connecting the control gate to a gate voltage $V_G$ being negative with respect to the source voltage $V_S$ such that electrons trapped in the charge trapping medium are erased by means of CHannel Induced Secondary Hole Injection (CHISHI).

2. The method according to claim 1 wherein the dielectric spacer is an oxide-nitride-oxide (ONO) layer.

3. The method according to claim 2 wherein the ONO layer comprise a silicon oxide layer and a silicon nitride layer.

4. The method according to claim 1 wherein the control gate comprises doped polysilicon.

5. The method according to claim 1 wherein the single-poly, P-channel non-volatile memory unit does not have a lightly doped drain (LDD) near the drain side.

6. The method according to claim 1 wherein the drain voltage $V_D$=−1V~−3V.

7. The method according to claim 1 wherein the N well voltage $V_{NW}$=2V~4V.

8. The method according to claim 1 wherein the gate voltage $V_G$=−1V~−3V.

* * * * *